(12) United States Patent
Feng

(10) Patent No.: US 11,937,390 B2
(45) Date of Patent: Mar. 19, 2024

(54) FOLDABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 273 days.

(21) Appl. No.: 17/619,262

(22) PCT Filed: Nov. 30, 2021

(86) PCT No.: PCT/CN2021/134360
§ 371 (c)(1),
(2) Date: Dec. 15, 2021

(87) PCT Pub. No.: WO2023/087390
PCT Pub. Date: May 25, 2023

(65) Prior Publication Data
US 2023/0164939 A1 May 25, 2023

(51) Int. Cl.
*H05K 5/02* (2006.01)
*H05K 5/00* (2006.01)

(52) U.S. Cl.
CPC ......... *H05K 5/0226* (2013.01); *H05K 5/0018* (2022.08)

(58) Field of Classification Search
CPC ........................... H05K 5/0226; H05K 5/0018
USPC ........................................................ 361/807
See application file for complete search history.

(56) References Cited

U.S. PATENT DOCUMENTS

| 2015/0225201 A1 | 8/2015 | Watanabe et al. |
| 2022/0217863 A1* | 7/2022 | Kim ........................ B32B 17/10 |

FOREIGN PATENT DOCUMENTS

| CN | 1457228 A | 11/2003 |
| CN | 104464529 A | 3/2015 |
| CN | 105321430 A | 2/2016 |
| CN | 107395817 A | 11/2017 |
| CN | 107454229 A | 12/2017 |
| CN | 107564423 A | 1/2018 |
| CN | 107731100 A | 2/2018 |
| CN | 109495621 A | 3/2019 |
| CN | 110582804 A | 12/2019 |
| CN | 110703861 A | 1/2020 |
| CN | 111182102 A | 5/2020 |
| CN | 211117099 U | 7/2020 |
| CN | 112770554 A | 5/2021 |
| CN | 113241011 A | 8/2021 |

(Continued)

*Primary Examiner* — Binh B Tran
(74) *Attorney, Agent, or Firm* — Rivka Friedman

(57) ABSTRACT

A foldable display device includes a housing, a bending mechanism disposed in the housing, a flexible display panel disposed in the housing and on a side of the bending mechanism, and a front frame structure covering at least a part of a side surface of the flexible display panel. When the foldable display device is folded at any angle, an edge of the flexible display panel and the bending mechanism are encapsulated.

20 Claims, 6 Drawing Sheets

(56) References Cited

FOREIGN PATENT DOCUMENTS

| | | |
|---|---|---|
| CN | 113299195 A | 8/2021 |
| CN | 113314037 A | 8/2021 |
| CN | 113366408 A | 9/2021 |
| CN | 113534893 A | 10/2021 |
| CN | 113593416 A | 11/2021 |
| CN | 113669357 A | 11/2021 |
| JP | 2005342269 A | 12/2005 |
| TW | 201921221 A | 6/2019 |

* cited by examiner

FOLDABLE DISPLAY DEVICE

FIELD OF INVENTION

The present disclosure relates to a technical field of display, and particularly to a foldable display device.

BACKGROUND

Currently, foldable display devices have become a major development direction of display industry. In order to solve a problem that a surface size of a foldable display device does not match a size of a flexible screen before and after the foldable display device is folded, a support plate avoidance mechanism is usually disposed in a bending mechanism of an inwardly foldable display device. By avoiding a support plate, enough space is reserved for a folded flexible screen, and the flexible screen forms "a drop shape" in a bending area. In an outwardly foldable display device, it is necessary to make a surface of a bending mechanism contacting a flexible screen always match the flexible screen, so that the flexible screen is neither pulled nor squeezed.

Therefore, in the above designs, a housing is usually disposed to sliding relative to the bending mechanism, so as to accommodate an "extra" part of the flexible screen when the foldable display device is folded inside and outside. However, a change of a gap between the housing and the bending mechanism will make an edge of the flexible screen difficult to be encapsulated, so that impurities such as dust may enter the flexible screen from a side of the flexible screen, causing problems such as poor display of the flexible screen.

SUMMARY OF DISCLOSURE

The present disclosure provides a foldable display device to solve a technical problem that an edge of a flexible display panel is difficult to be encapsulated due to a change of a gap between a housing and a bending mechanism of a current foldable display device.

In order to solve the technical problem, the present disclosure provides a foldable display device comprising:
  a housing comprising a first housing and a second housing;
  a bending mechanism disposed in the housing, connected to the first housing and the second housing, and comprising:
    a bending portion;
    a first support portion disposed on a side of the bending portion, corresponding to the first housing, and comprising a first support plate and a first movement mechanism, wherein the first support plate is rotatably connected to the side of the bending portion, an end of the first movement mechanism is slidably connected to the first support plate, and another end of the first movement mechanism is fixedly connected to the first housing; and
    a second support portion disposed on an opposite side of the bending portion, corresponding to the second housing, and comprising a second support plate and a second movement mechanism, wherein the second support plate is rotatably connected to the opposite side of the bending portion, an end of the second movement mechanism is slidably connected to the second support plate, and another end of the second movement mechanism is fixedly connected to the second housing;
  a flexible display panel disposed in the housing and on sides of the first housing, the second housing, and the bending mechanism, wherein when the flexible display panel is in a folded state, both the first housing and the second housing are away from or close to the bent portion; and
  a front frame structure disposed on a side of the flexible display panel away from the housing, covering at least a part of a side surface of the flexible display panel, and comprising a first front frame portion connected to the first housing, a second front frame portion connected to the first support portion, a third front frame portion connected to the second support portion, and a fourth front frame portion connected to the second housing.

The present disclosure has the following beneficial effects. In the present disclosure, a foldable display device is configured to comprise a housing, a bending mechanism disposed in the housing, a flexible display panel disposed in the housing and on a side of the bending mechanism, and a front frame structure covering at least a part of a side surface of the flexible display panel. The housing comprises a first housing and a second housing. The bending mechanism comprises a bending portion, a first support portion, and a second support portion. The first support portion comprises a first support plate and a first movement mechanism. The first support plate is rotatably connected to the side of the bending portion. An end of the first movement mechanism is slidably connected to the first support plate, and another end of the first movement mechanism is fixedly connected to the first housing, thereby driving the first housing away from or close to the bending portion. The second support portion comprises a second support plate and a second movement mechanism. The second support plate is rotatably connected to the opposite side of the bending portion. An end of the second movement mechanism is slidably connected to the second support plate, and another end of the second movement mechanism is fixedly connected to the second housing, thereby driving the second housing away from or close to the bending portion. The front frame structure comprises a first front frame portion connected to the first housing, a second front frame portion connected to the first support portion, a third front frame portion connected to the second support portion, and a fourth front frame portion connected to the second housing. During bending of the folding display device, the first front frame portion moves away from or close to the bending portion along with the first housing, the second front frame portion is connected to the first support plate, the third front frame portion is connected to the second support plate, and the second front frame portion moves away from or close to the bending portion along with the second housing. Therefore, when the folding display device is folded at any angle, sides of the flexible display panel and a gap between the housing and the bending mechanism are encapsulated, thereby preventing the flexible display panel from being exposed and damaged.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Figure 1:
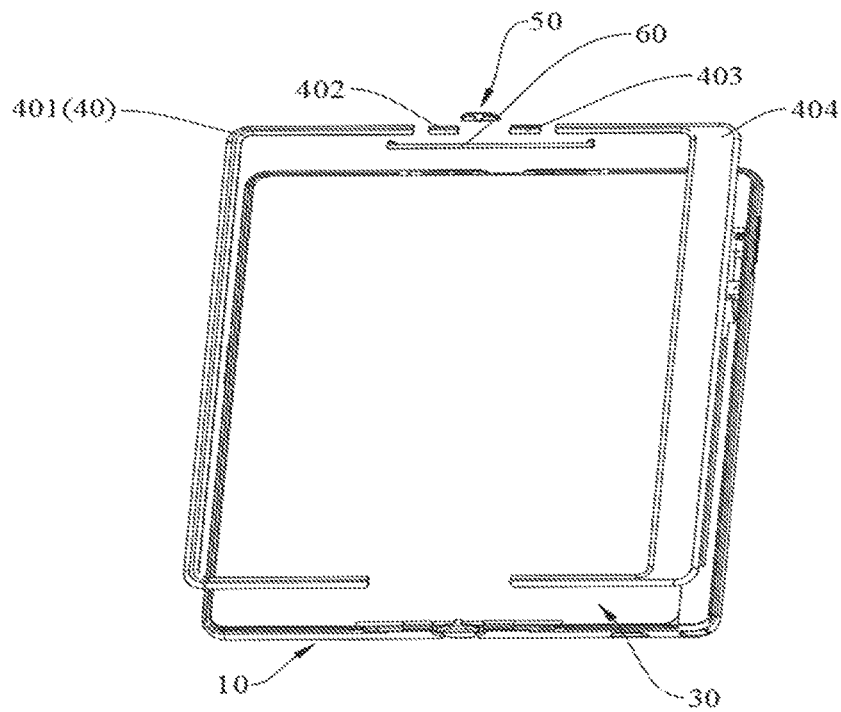
FIG. 1 is a schematic structural diagram of a foldable display device according to an embodiment of the present disclosure.

The present disclosure provides a foldable display device. In order to make purposes, technical solutions, and effects of the present invention clearer and more definite, the present invention will be further described in detail below with reference to accompanying drawings and embodiments. It should be understood that specific embodiments described herein are only used to explain the present invention, not used to limit the present invention.

Please refer to FIG. 1 to FIG. 10. The present disclosure provides a foldable display device. The foldable display device comprises a housing 10, a bending mechanism 20 disposed in the housing 10, a flexible display panel 30 disposed in the housing 10 and on a side of the bending mechanism 20, and a front frame structure 40 covering at least a part of a side surface of the flexible display panel 30. The housing 10 comprises a first housing 11 and a second housing 12. The bending mechanism 20 comprises a bending portion 21, a first support portion 22 disposed on a side of the bending portion 21 and corresponding to the first housing 11, and a second support portion 23 disposed on an opposite side of the bending portion 21 and corresponding to the second housing 12. A side of the first support portion 22 is rotatably connected to the side of the bending portion 21, and an opposite side of the first support portion 22 is slidably connected to the first housing 11. A side of the second support portion 23 is rotatably connected to the opposite side of the bending portion 21, and an opposite side of the second support portion 23 is slidably connected to the second housing 12. The front frame structure 40 comprises a first front frame portion 401 connected to the first housing 11, a second front frame portion 402 connected to the first support portion 22, a third front frame portion 403 connected to the second support portion 23, and a fourth front frame portion 404 connected to the second housing 12. When the folding display device is folded at any angle, sides of the flexible display panel 30 and a gap between the housing 10 and the bending mechanism 20 are encapsulated, thereby preventing the flexible display panel 30 from being exposed and damaged.

The present disclosure will be further described in detail below in combination with the accompanying drawings and the specific embodiments.

Figure 2:
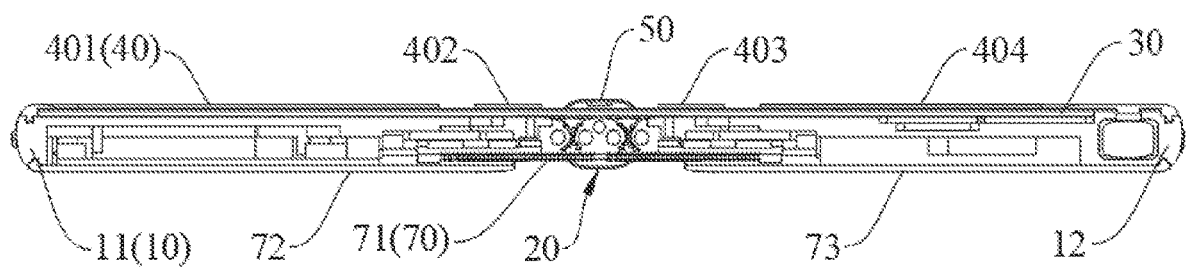
FIG. 2 is a schematic structural diagram of the foldable display device in an unfolded state according to an embodiment of the present disclosure.
Figure 3:
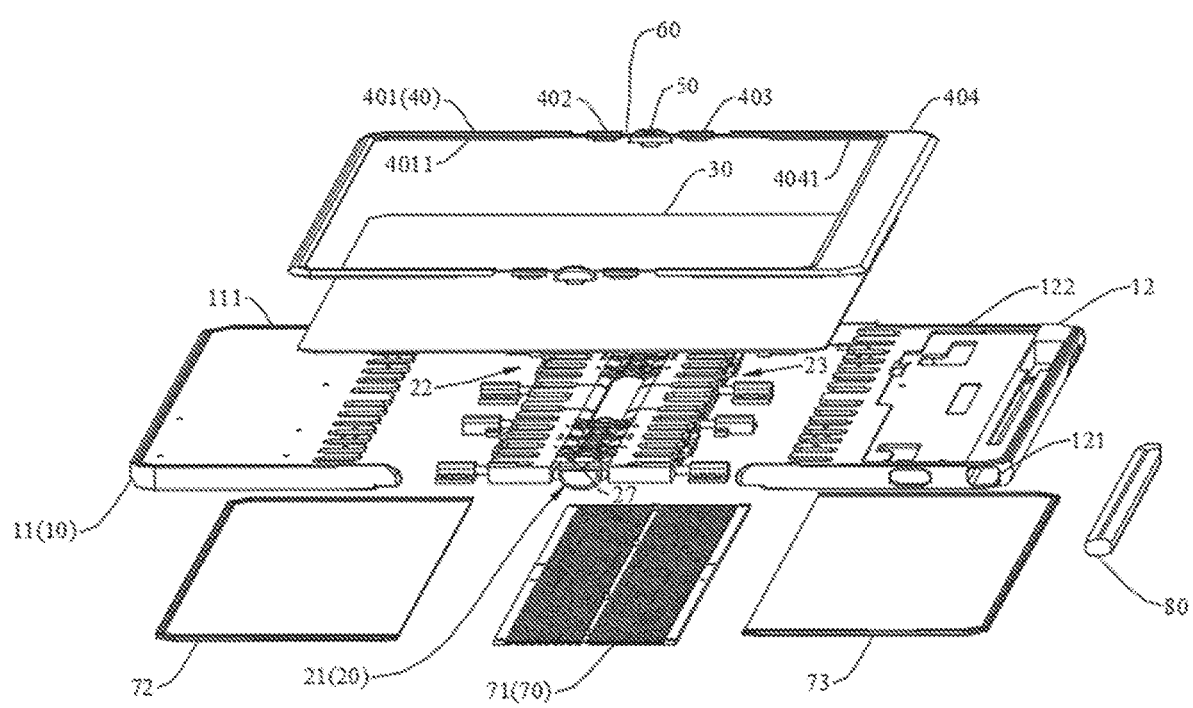
FIG. 3 is an exploded view of the foldable display device according to an embodiment of the present disclosure.

Please refer to FIG. 1 to FIG. 3. FIG. 1 is a schematic structural diagram of a foldable display device according to an embodiment of the present disclosure. FIG. 2 is a schematic structural diagram of the foldable display device in an unfolded state according to an embodiment of the present disclosure. FIG. 3 is an exploded view of the foldable display device according to an embodiment of the present disclosure.

The present disclosure provides a foldable display device. The foldable display device comprises a housing 10, a bending mechanism 20 disposed in the housing 10, a flexible display panel 30 disposed in the housing 10 and on a side of the bending mechanism 20, and a front frame structure 40 covering at least a part of a side surface of the flexible display panel 30.

The housing 10 comprises a first housing 11 and a second housing 12 disposed opposite to each other. The bending mechanism 20 is housed in the housing 10 and connected to the first housing 11 and the second housing 12. Furthermore, when the foldable display device is in an unfolded state, a surface of the bending mechanism 20 facing the flexible display panel 30 and a surface of the housing 10 facing the flexible display panel 30 are coplanar to form a support surface for the flexible display panel 30.

Figure 4:
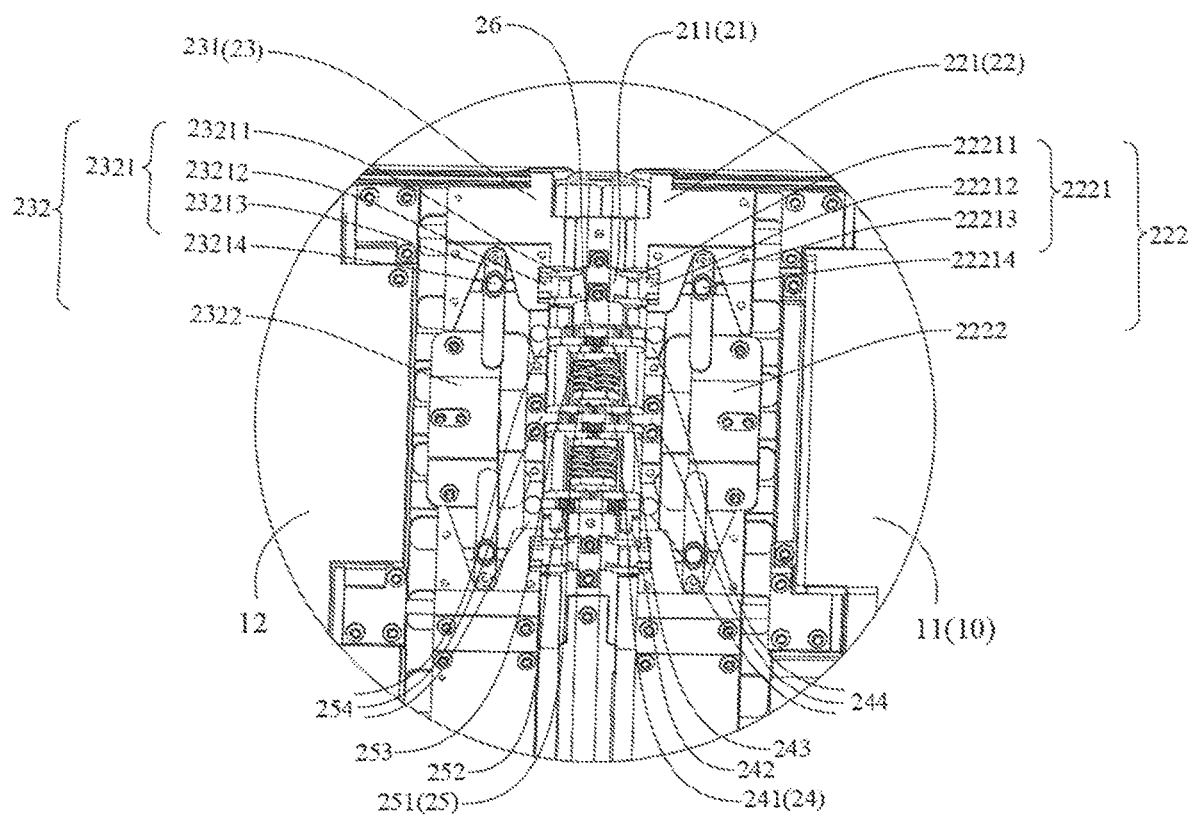
FIG. 4 is a schematic structural diagram of a backside of a bending mechanism in the unfolded state according to an embodiment of the present disclosure.

Specifically, please refer to FIG. 3 and FIG. 4. FIG. 4 is a schematic structural diagram of a backside of a bending mechanism in the unfolded state according to an embodiment of the present disclosure.

In this embodiment, the bending mechanism 20 comprises a bending portion 21, a first support portion 22, and a second support portion 23. The first support portion 22 comprises a first support plate 221 and a first movement mechanism 222. The first support plate 221 is rotatably connected to the side of the bending portion 21. An end of the first movement mechanism 222 is slidably connected to the first support plate 221, and another end of the first movement mechanism 222 is fixedly connected to the first housing 11, thereby driving the first housing 11 away from or close to the bending portion 21. The second support portion 23 comprises a second support plate 231 and a second movement mechanism 232. The second support plate 231 is rotatably connected to the opposite side of the bending portion 21. An end of the second movement mechanism 232 is slidably connected to the second support plate 231, and another end of the second movement mechanism 232 is fixedly connected to the second housing 12, thereby driving the second housing 12 away from or close to the bending portion 21.

Specifically, the first movement mechanism 222 is rotatably connected to the side of the bending portion 21 along a first axis. The second movement mechanism 232 is disposed opposite to the first movement mechanism 222 and rotatably connected to the opposite side of the bending portion 21 along a second axis. When the flexible display panel 30 is in a folded state, both the first housing 11 and the second housing 12 are away from or close to the bent portion 21.

In this embodiment, the first movement mechanism 222 is rotatably connected to the side of the bending portion 21 along the first axis. The second movement mechanism 232 is rotatably connected to the opposite side of the bending portion 21 along the second axis. The first movement mechanism 222 is disposed opposite to the second movement mechanism 232. When the flexible display panel 30 is in the folded state, both the first housing 11 and the second housing 12 are away from or close to the bent portion 21. This is beneficial for the first support portion 22 and the second support portion 23 to form a wedge shape when the bending mechanism 20 is folded inwardly, thereby leaving a larger accommodating space for the flexible display panel 30 in the folded state. Furthermore, when the bending mechanism 20 is folded outward, the first housing 11 and the second housing 12 are both close to the bending portion 21, so that a size of the housing 10 and a size of the flexible display panel 30 are kept matched, thereby preventing the flexible display panel 30 from being exposed and damaged.

Moreover, in this embodiment, the bending portion 21 comprises a fixing bracket 211. One end of the first movement mechanism 222 is rotatably connected to the fixing bracket 211, and another one end of the first movement mechanism 222 is connected to the first support plate 221. One end of the second movement mechanism 232 is rotatably connected to the fixing bracket 211, and another one end of the second movement mechanism 232 is connected to the second support plate 231.

The first movement mechanism 222 comprises a first transmission mechanism 2221 and a first sliding plate 2222. The second movement mechanism 232 comprises a second transmission mechanism 2321 and a second sliding plate 2322. The first transmission mechanism 2221 is rotatably connected to the bending portion 21 along the first axis. The first transmission mechanism 2221 is slidably connected to the first sliding plate 2222 to drive the first sliding plate 2222 away from or close to the bending portion 21. The first sliding plate 2222 is fixedly connected to the first housing 11. The second transmission mechanism 2321 is rotatably connected to the bending portion 21 along the second axis. The second transmission mechanism 2321 is slidably connected to the second sliding plate 2322 to drive the second sliding plate 2322 away from or close to the bending portion 21. The second sliding plate 2322 is fixedly connected to the second housing 12.

Specifically, the first transmission mechanism 2221 comprises a first transmission member 22211, a first sliding block 22212, and a first swing rod 22213. The second transmission mechanism 2321 comprises a second transmission member 23211, a second sliding block 23212, and a second swing rod 23213.

One end of the first transmission member 22211 is rotatably connected to the fixing bracket 211, and another end of the first transmission member 22211 is rotatably connected to one end of the first sliding block 22212. Another end of the first sliding block 22212 is movably connected to the first swing rod 22213. One end of the first swing rod 22213 is rotatably connected to the first support plate 221, and the other end of the first swing rod 22213 is movably connected to the first sliding plate 2222. The first sliding plate 2222 is fixedly connected to the first housing 11.

One end of the second transmission member 23211 is rotatably connected to the fixing bracket 211, and another end of the second transmission member 23211 is rotatably connected to one end of the second sliding block 23212. Another end of the second sliding block 23212 is movably connected to the second swing rod 23213. One end of the second swing rod 23213 is rotatably connected to the second support plate 231, and the other end of the second swing rod 23213 is movably connected to the second sliding plate 2322. The second sliding plate 2322 is fixedly connected to the second housing 12.

The first support plate 221 is rotatably connected to the bending portion 21 along a third axis. The first sliding plate 2222 is slidably disposed on the first support plate 221. The second support plate 231 is rotatably connected to the bending portion 21 along a fourth axis. The second sliding plate 2322 is slidably disposed on the second support plate 231. Specifically, the first support plate 221 is provided with a first sliding groove (not shown). The second support plate 231 is provided with a second sliding groove (not shown). The first sliding block 22212 is slidably disposed in the first sliding groove. The second sliding block 23212 is slidably disposed in the second sliding groove.

In this embodiment, the bending mechanism 20 further comprises a first rotating mechanism 24 rotatably connected to the bending portion 21 along a fifth axis, and a second rotating mechanism 25 rotatably connected to the bending portion 21 along a sixth axis. The first rotating mechanism 24 comprises a first rotating member 241, a second rotating member 242, a third transmission member 243, and a first linkage fixing member 244. The second rotating mechanism 25 comprises a third rotating member 251, a fourth rotating member 252, a fourth transmission member 253, and a second linkage fixing member 254. It can be understood that the first axis, the third axis, and the fifth axis are parallel to each other, and the second axis, the fourth axis, and the sixth axis are parallel to each other.

The first rotating member 241 is rotatably connected to the bending portion 21 along the fifth axis. The third transmission member 243 is sleeved on the first rotating member 241. The second rotating member 242 is rotatably connected to the third transmission member 243 along the third axis. The first linkage fixing member 244 is sleeved on the second rotating member 242 and fixed to the first support plate 221. The third rotating member 251 is rotatably connected to the bending portion 21 along the sixth axis. The fourth transmission member 253 is sleeved on the third rotating member 251. The fourth rotating member 252 is rotatably connected to the fourth transmission member 253 along the sixth axis. The second linkage fixing member 254 is sleeved on the fourth rotating member 252 and fixed to the second support plate 231. Specifically, the third transmission member 243 is provided with a first gear portion (not shown). The fourth transmission member 253 is provided with a second gear portion (not shown). The first linkage fixing member 244 is provided with a third gear portion (not shown). The second linkage fixing member 254 is provided with a fourth gear portion (not shown). The first gear portion meshes with the second gear portion. The third gear portion meshes with the fourth gear portion.

The bending mechanism 20 further comprises a fixing block 26. The first rotating member 241 and the third rotating member 251 are rotatably connected to the fixing block 26. Each of opposite sides of the fixing block 26 is provided with a rack. The first linkage fixing member 244 is provided with a fifth gear portion (not shown). The second linkage fixing member 254 is provided with a sixth gear portion (not shown). The fifth gear portion and the sixth gear portion respectively mesh with the racks.

It is understandable that in this embodiment, the bending mechanism 20 may further comprise a third rotating mechanism and a fourth rotating mechanism that are disposed opposite to each other, and a fifth rotating mechanism and a sixth rotating mechanism that are disposed opposite to each other. Their structures and meshing relationships are same as those of the first rotating mechanism 24 and the second rotating mechanism 25, which are not described in this embodiment.

Figure 5:
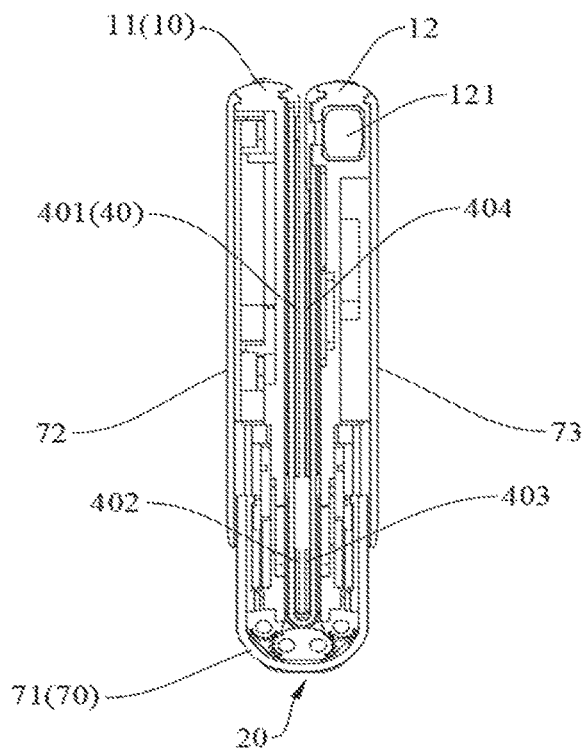
FIG. 5 is a schematic diagram of the foldable display device in a first folded state according to an embodiment of the present disclosure.
Figure 6:
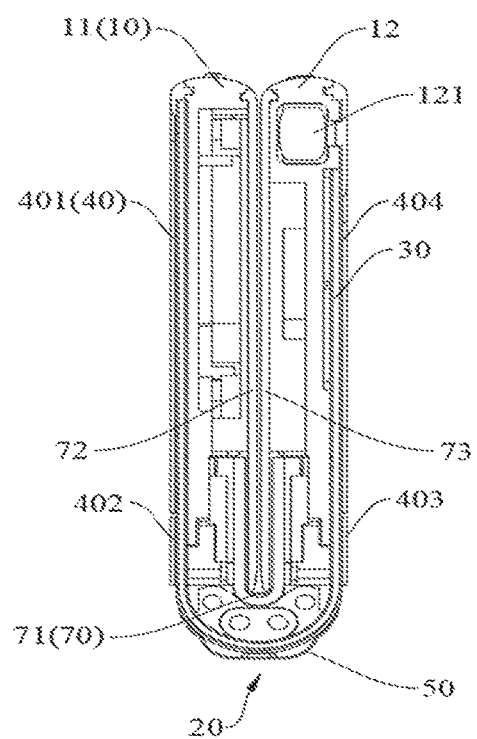
FIG. 6 is a schematic diagram of the foldable display device in a second folded state according to an embodiment of the present disclosure.

Please refer to FIG. 4 to FIG. 6. FIG. 5 is a schematic diagram of the foldable display device in a first folded state according to an embodiment of the present disclosure. FIG. 6 is a schematic diagram of the foldable display device in a second folded state according to an embodiment of the present disclosure.

In this embodiment, one of a first folded state and a second folded state is an inwardly folded state, and the other is an outwardly folded state. Furthermore, in this embodiment, the first folded state is the inwardly folded state, and the second folded state is the outwardly folded state as an example. It should be noted that when the foldable display device is in the inwardly folded state, the flexible display panel 30 is located between the first housing 11 and the second housing 12. When the folding display device is in the outwardly folded state, the first housing 11 and the second housing 12 are both located inside the flexible display panel 30.

In this embodiment, the first transmission mechanism 2221 further comprises a first fixing member 22214. The second transmission mechanism 2321 further comprises a second fixing member 23214. The first swing rod 22213 is provided with a third sliding groove (not shown). The second swing rod 23213 is provided with a fourth sliding groove (not shown). The first fixing member 22214 passes through the third sliding groove and is fixedly connected to the first sliding block 22212. The second fixing member 23214 passes through the fifth sliding groove and is fixedly connected to the second sliding block 23212. It should be noted that the first fixing member 22214 and the second fixing member 23214 may be, but are not limited to, axle pins.

The first transmission mechanism 2221 further comprises a third fixing member (not shown). The second transmission mechanism 2321 further comprises a fourth fixing member (not shown). The first sliding plate 2222 is provided with a fifth sliding groove (not shown). The second sliding plate 2322 is provided with a sixth sliding groove (not shown). The third fixing member passes through the fifth sliding groove and is fixedly connected to the first swing rod 22213. The fourth fixing member passes through the sixth sliding groove and is fixedly connected to the second swing rod 23213. It should be noted that the third fixing member and the fourth fixing member may be, but are not limited to, convex structures.

Specifically, the first rotating member 241 and the third rotating member 251 are rotatably connected to the fixing block 26. The opposite sides of the fixing block 26 are respectively provided with two racks. The fifth gear portion and the sixth gear portion respectively mesh with the two racks. The first gear portion meshes with the second gear portion. The third gear portion meshes with the fourth gear portion. Therefore, when the flexible display panel 30 is in a folded state, the bending mechanism 20 rotates symmetrically. The first transmission member 22211 pushes the first sliding block 22212 to slide in the first sliding groove. The second transmission member 23211 pushes the second sliding block 23212 to slide in the second sliding groove. The first sliding block 22212 pushes the first swing rod 22213 to rotate by a first angle through the first fixing member 22214. The second sliding block 23212 pushes the second swing rod 23213 to rotate by a second angle through the second fixing member 23214. The first angle is same as the second angle.

Furthermore, the first swing rod 22213 pushes the first sliding plate 2222 to slide in the first support plate 221 through the third fixing member, so as to drive the first housing 11 away from or close to the bending portion 21. The second swing rod 23213 pushes the second sliding plate 2322 to slide in the second support plate 231 through the fourth fixing member, so as to drive the second housing 12 away from or close to the bending portion 21. Therefore, when the flexible display panel 30 is in the folded state, the size of the housing 10 and the size of the flexible display panel 30 are kept matched, so that the flexible display panel 30 will not be greatly pulled or squeezed during bending.

Specifically, as shown in FIG. 5, when the flexible display panel 30 is in the first folded state, the first housing 11 and the second housing 12 are both located away from the bending portion 21. As shown in FIG. 6, when the flexible display panel 30 is in the second folded state, the first housing 11 and the second housing 12 are both located close to the bending portion 21.

Figure 7:
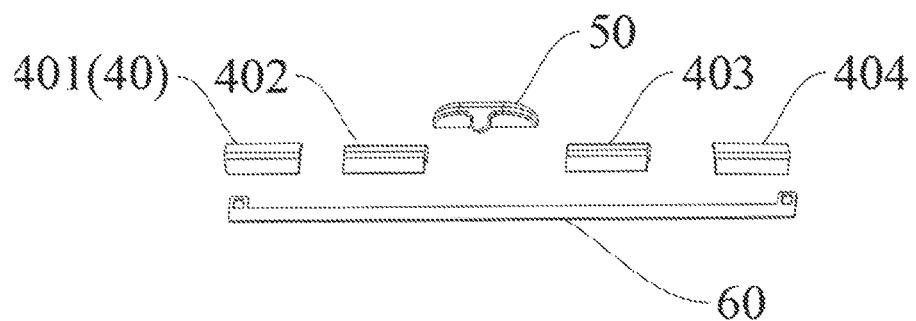
FIG. 7 is a schematic structural diagram of a front frame structure according to an embodiment of the present disclosure when the foldable display device is in the unfolded state.

Please refer to FIG. 3 and FIG. 7. FIG. 7 is a schematic structural diagram of a front frame structure according to an embodiment of the present disclosure when the foldable display device is in the unfolded state.

In this embodiment, the front frame structure 40 is disposed on a side of the flexible display panel 30 away from the housing 10 and covers at least a part of the side surface of the flexible display panel 30. The front frame structure 40 comprises a first front frame portion 401 connected to the first housing 11, a second front frame portion 402 connected to the first support portion 22, a third front frame portion 403 connected to the second support portion 23, and a fourth front frame portion 404 connected to the second housing 12.

It can be understood that in this embodiment, the front frame structure 40 is configured as four independent parts, that is, the first front frame portion 401 connected to the first housing 11, the second front frame portion 402 connected to the first support portion 22, the third front frame portion 403 connected to the second support portion 23, and the fourth front frame portion 404 connected to the second housing 12. The first housing 11 is separated from the first front frame portion 401 by a fixed distance. The first support plate 221 is separated from the second front frame portion 402 by a fixed distance. The second support plate 231 is separated from the third front frame portion 403 by a fixed distance. The second housing 12 is separated from the fourth front frame portion 404 by a fixed distance. This prevents impurities from easily entering the foldable display device due to an increase in a distance between the front frame structure 40 and the flexible display panel 30 during bending of the foldable display device, thereby effectively reducing a risk of impurities entering the foldable display device.

Figure 8:
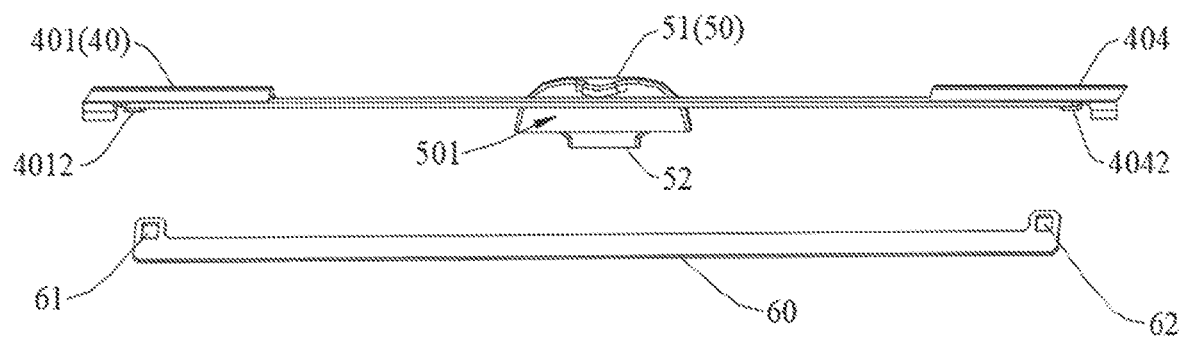
FIG. 8 is a schematic structural diagram of a first front frame portion, a fourth front frame portion, a dust plug, and a soft strip according to an embodiment of the present disclosure.
Figure 9:
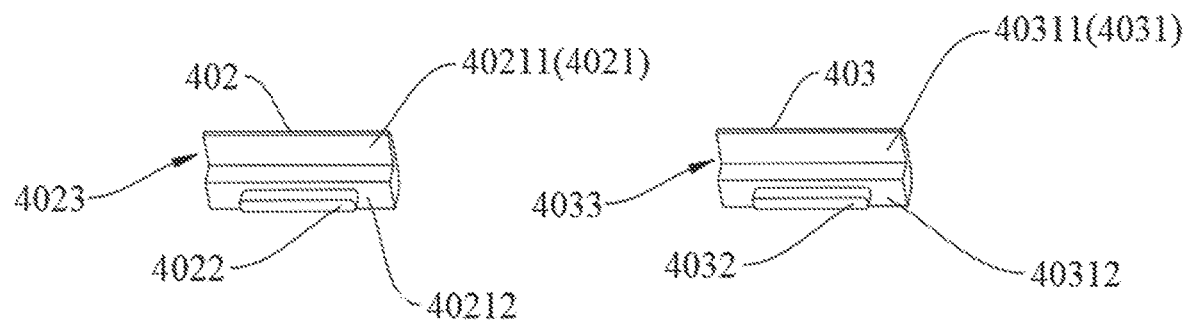
FIG. 9 is a schematic structural diagram of a second front frame portion and a third front frame portion according to an embodiment of the present disclosure.

Please refer to FIG. 3, FIG. 8, and FIG. 9. FIG. 8 is a schematic structural diagram of a first front frame portion, a fourth front frame portion, a dust plug, and a soft strip according to an embodiment of the present disclosure. FIG. 9 is a schematic structural diagram of a second front frame portion and a third front frame portion according to an embodiment of the present disclosure.

In this embodiment, the first front frame portion 401 is provided with a first buckle 4011 on its side close to the first housing 11. The first housing 11 is provided with a first slot 111 corresponding to the first buckle 4011. The first buckle 4011 is fixedly connected to the first slot 111 to fixedly connect the first front frame portion 401 and the first housing 11. It can be understood that when the foldable display device is bent from the unfolded state to the first folded state or the second folded state, the first housing 11 moves close to or away from the bending portion 21, and the first front frame portion 401 moves close to or away from the bending portion 21 along with the first housing 11 through the first buckle 4011.

The fourth front frame portion 404 is provided with a second buckle 4041 on its side close to the second housing 12. The second housing 12 is provided with a second slot 122 corresponding to the second buckle 4041. The second buckle 4041 is fixedly connected to the second slot 122 to fixedly connect the second front frame portion 402 and the second housing 12. It can be understood that when the foldable display device is bent from the unfolded state to the first folded state or the second folded state, the second housing 12 moves close to or away from the bending portion 21, and the second front frame portion 401 moves close to or away from the bending portion 21 along with the second housing 12 through the second buckle 4041.

The second front frame portion 402 comprises a first package body 4021 and a first extension portion 4022 disposed on the first package body 4021. The second front frame portion 402 is connected to the first support plate 221 through the first extension portion 4022. The third front frame portion 403 comprises a second package body 4031 and a second extension portion 4032 disposed on the second package body 4031. The third front frame portion 403 is connected to the second support plate 231 through the second extension portion 4032. It is understandable that the first extension portion 4022 may be a pin-shaped structure or a hook-shaped structure, and the first support plate 221 is provided with a hole-like structure corresponding to the first extension portion 4022, so as to realize a connection between the first extension portion 4022 and the first support plate 221. The second extension portion 4032 may be a pin-shaped structure or a hook-shaped structure, and the second support plate 231 is provided with a hole-like structure corresponding to the second extension portion 4032, so as to realize a connection between the second extension portion 4032 and the second support plate 231.

Specifically, the first package body 4021 comprises a first front end 40211 and a first side end 40212. The first front end 40211 is disposed corresponding to a light-emitting surface of the flexible display panel 30. The first side end 40212 is disposed corresponding to the side surface of the flexible display panel 30. The first side end 40212 comprises the first extension portion 4022. The second package body 4031 comprises a second front end 40311 and a second side end 40312. The second front end 40311 is disposed corresponding to the light-emitting surface of the flexible display panel 30. The second side end 40312 is disposed corresponding to the side surface of the flexible display panel 30. The second side end 40312 comprises the second extension portion 4032. It is understandable that the first front end 40211 and the first side end 40212 may be integrally formed, and the second front end 40311 and the second side end 40312 may be integrally formed.

Furthermore, the first front end 40211 is disposed on the light-emitting surface of the flexible display panel 30, the first side end 40212 is disposed on the side surface of the flexible display panel 30, thereby forming a covering structure for an edge of the flexible display panel 30. The second front end 40311 is disposed on the light-emitting surface of the flexible display panel 30, the second side end 40312 is disposed on the side surface of the flexible display panel 30, thereby forming another covering structure for the edge of the flexible display panel 30.

It can be understood that in this embodiment, when the foldable display device is bent from the unfolded state to the first folded state or the second folded state, the distance between the front frame structure 40 and the flexible display panel 30 is always kept constant. The first front frame portion 401 is fixedly connected to the first housing 11, which restricts the first front frame portion 401 from moving synchronously with the first housing 11. The fourth front frame portion 404 is fixedly connected to the second housing 12, which restricts the fourth front frame portion 404 from moving synchronously with the second housing 12. This avoids an increase in a distance between the front frame structure 40 and the housing 10 during the bending of the foldable display device. Furthermore, the second front frame portion 402 is connected to the first support plate 221, which restricts the second front frame portion 402 from moving synchronously with the first support plate 221. The third front frame portion 403 is connected to the second support plate 231, which restricts the third front frame portion 403 from moving synchronously with the second support plate 231. This avoids the increase in the distance between the front frame structure 40 and the flexible display panel 30 during the bending.

Moreover, in this embodiment, the foldable display device further comprises a soft strip 60 disposed on a side of the light-emitting surface of the flexible display panel 30. The soft strip 60 is disposed between the front frame structure 40 and the flexible display panel 30, and opposite ends of the soft strip 60 are respectively connected to the first front frame portion 401 and the fourth front frame portion 404. It is understandable that the soft strip 60 is made of a flexible material. During the bending of the foldable display device, the soft strip 60 is bent along with the flexible display panel 30, thereby further preventing external impurities from entering the foldable display device.

Furthermore, the opposite ends of the soft strip 60 are respectively provided with a first opening 61 and a second opening 62. An end of the first front frame portion 401 close to the second front frame portion 402 is provided with a first hook 4012. An end of the fourth front frame portion 404 close to the third front frame portion 403 is provided with a second hook 4042. The first hook 4012 is connected to one end of the soft strip 60 through the first opening 61, and the second hook 4042 is connected to the other end of the soft strip 60 through the second opening 62, so that the soft strip 60 is connected between the first front frame portion 401 and the fourth front frame portion 404.

The soft strip 60 is covered by the second front frame portion 402 and the third front frame portion 403, and is constrained by the second front frame portion 402 and the third front frame portion 403 to be located on the light-emitting surface of the flexible display panel 30. Specifically, the second front frame portion 402 is provided with a first sliding rail 4023 on its side close to the soft strip 60. The flexible strip 60 is at least partially disposed in the first sliding rail 4023. The soft strip 60 is slidably connected with the second front frame portion 402. The third front frame portion 403 is provided with a second sliding rail 4033 on its side close to the soft strip 60. The soft strip 60 is at least partially disposed in the second sliding rail 4033. The soft strip 60 is slidably connected with the third front frame portion 403.

Moreover, the first front end 40211 is located on a side of the soft strip 60 away from the flexible display panel 30, and the first side end 40212 is located on a side surface of the soft strip 60, thereby forming the first sliding rail 4023 covering an edge of the soft strip 60. The second front end 40311 is located on the side of the soft strip 60 away from the flexible display panel 30, and the second side end 40312 is located on the side surface of the soft strip 60, thereby forming the second sliding rail 4033 covering the edge of the soft strip 60. The soft strip 60 slides in the first sliding rail 4023 and the second sliding rail 4033, and the soft strip 60 is fixed between the front frame structure 40 and the flexible display panel 30.

It can be understood that the first front frame portion 401, the second front frame portion 402, the third front frame portion 403, and the fourth front frame portion 404 are respectively connected to the first housing 11, the first support plate 221, the second support plate 231, and the second housing 12, so as to fix the flexible display panel 30 and the soft strip 60 in the folded state on the bending mechanism 20.

As shown in FIG. 5, when the bending mechanism 20 is in the first folded state, the first front frame portion 401, the second front frame portion 402, the third front frame portion 403, the fourth front frame portion 404, the soft strip 60 and the flexible display panel 30 are all located between the first housing 11 and the second housing 12, the first front frame portion 401 and the second front frame portion 402 are both close to the bending portion 21, and the soft strip 60 is in a compressed state. As shown in FIG. 6, when the bending mechanism 20 is in the second folded state, the first front frame portion 401 and the second front frame portion 402 are both located on a side of the flexible display panel 30 away from the first housing 11, the third front frame portion 403 and the fourth front frame 404 are both located on a side of the flexible display panel 30 away from the second housing 12, the soft strip 60 is located on the side of the flexible display panel 30 away from the housing 10, the first front frame portion 401 and the second front frame portion 402 are both away from the bending portion 21, and the soft strip 60 is in a stretched state. Accordingly, when the flexible display panel 30 is in the folded state, the flexible strip 60 is always located between the front frame structure 40 and the flexible display panel 30.

In this embodiment, the foldable display device further comprises a dust plug 50 disposed on the side surface of the flexible display panel 30 and corresponding to the bending portion 21. The dust plug 50 comprises a third sliding rail 501. The soft strip 60 is at least partially disposed in the third sliding rail 501 and is slidably connected with the dust plug 50.

specifically, the dust plug 50 comprises a body part 51 and a hook part 52. The body part 51 is disposed corresponding to the side surface of the flexible display panel 30. The hook part 52 is disposed on the side of the soft strip 60 away from the flexible display panel 30. The third sliding rail 501 is provided at a junction of the body part 51 and the hook part 52.

Furthermore, the foldable display device further comprises a rear cover 27 disposed corresponding to the bending portion 21. The rear cover 27 is connected to the bending portion 21. The rear cover 27 is located on a side of the bending mechanism 20 away from the flexible display panel 30. The body part 51 of the dust plug 50 is connected with the rear cover 27.

Specifically, the body part 51 is fixedly connected to the rear cover 27 through an opening in the rear cover 27. The hook part 52 squeezes and fixes the soft strip 60 to the flexible display panel 30. It is understandable that the dust plug 50 is used to further fix the soft strip 60 on the flexible display panel 30 to improve dustproof effect of the soft strip 60. Furthermore, the dust plug 50 itself can block a part of external impurities from entering the foldable display device.

Figure 10:
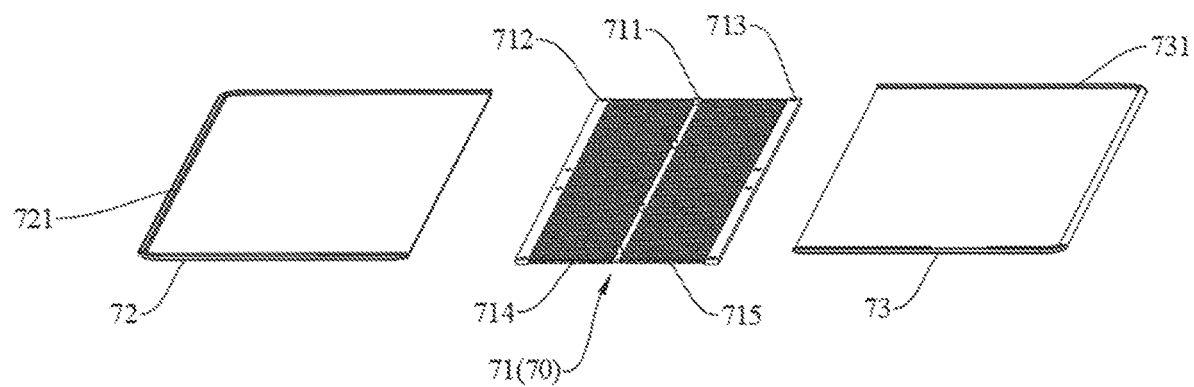
FIG. 10 is a schematic structural diagram of a shielding mechanism according to an embodiment of the present disclosure when the foldable display device is in the unfolded state.

Please refer to FIG. 3 and FIG. 10. FIG. 10 is a schematic structural diagram of a shielding mechanism according to an embodiment of the present disclosure when the foldable display device is in the unfolded state.

In this embodiment, the foldable display device further comprises a shielding mechanism 70. The shielding mechanism 70 is disposed on a side of the bending mechanism 20 away from the flexible display panel 30 and covers the flexible display panel 30. It can be understood that the shielding mechanism 70 is configured to shield and protect the bending mechanism 20 when the foldable display device is in the folded state.

The shielding mechanism 70 comprises an elastic shielding member 71 covering the bending mechanism 20, a first shielding member 72 disposed on a side of the elastic shielding member 71 and fixedly connected to the first housing 11, and a second shielding member 73 disposed on an opposite side of the elastic shielding member 71 and fixedly connected to the second housing 12. The elastic shielding member 71 is connected to the bending mechanism 20. A surface of the first shielding member 72 facing the flexible display panel 30 and a surface of the second shielding member 73 facing the flexible display panel 30 are coplanar to form a support surface for the flexible display panel 30.

In this embodiment, sides of the first shielding member 72 close to the first housing 11 are provided with one or more third buckles 721. The first housing 11 is further provided with one or more third slots (not shown) corresponding to the third buckles 721. The third buckles 721 are fixedly connected to the third slots, so that the first shielding member 72 is fixedly connected to the first housing 11. It can be understood that when the foldable display device is bent from the unfolded state to the first folded state or the second folded state, the first housing 11 moves close to or away from the bending portion 21, and the first shielding member 72 moves close to or away from the bending portion 21 along with the first housing 11 through the third buckles 721

Sides of the second shielding member 73 close to the second housing 12 are provided with one or more fourth buckles 731. The second housing 12 is further provided with one or more fourth slots (not shown) corresponding to the fourth buckles 731. The fourth buckles 731 are fixedly connected to the fourth slots. It can be understood that when the foldable display device is bent from the unfolded state to the first folded state or the second folded state, the second housing 12 moves close to or away from the bending portion 21, and the second shielding member 73 moves close to or away from the bending portion 21 along with the second housing 12 through the fourth buckles 731.

Optionally, the first shielding member 72 comprises a first side, a second side, a third side, and a fourth side. The first side is parallel to the second side. The third side is parallel to the fourth side. The third side is close to the elastic shielding member 71. The third buckles 721 are disposed on the first side, the second side, and the fourth side. The first housing 11 is provided with the third slots corresponding to the third buckles 721. The third buckles 721 are fixedly connected to the third slots. The second shielding member 73 comprises a fifth side, a sixth side, a seventh side, and an eighth side. The fifth side is parallel to the sixth side. The seventh side is parallel to the eighth side. The seventh side is close to the elastic shielding member 71. The fourth buckles 731 are disposed on the fifth side, the sixth side, and the eighth side. The second housing 12 is provided with the fourth slots corresponding to the fourth buckles 731. The fourth buckles 731 are fixedly connected to the fourth slots.

The elastic shielding member 71 comprises a first hard part 711 located at its middle part, and a second hard part 712 and a third hard part 713 that are located at its opposite sides. The first hard part 711 is fixedly connected to the bending portion 21. The second hard part 712 is fixedly connected to the first support portion 22. The third hard part 713 is fixedly connected to the second support portion 23.

Specifically, the second hard part 712 is fixedly connected to a side of the first support plate 221 away from the bending portion 21. The first hard part 711 is fixedly connected to an axis of the bending portion 21. The third hard part 713 is fixedly connected to a side of the second support plate 231 away from the bending portion 21. A first soft part 714 is disposed between the second hard part 712 and the first hard part 711. A second soft part 715 is disposed between the first hard part 711 and the third hard part 713. It is understandable that the second hard part 712 may be fixed on the first support plate 221 by screws, the first hard part 711 may be fixed on the bending portion 21 by screws, and the third hard part 713 may be fixed on the second support plate 231 by screws, which are not specifically limited in this embodiment.

Furthermore, the first shielding member 72 covers at least a part of the first soft part 714. The second shielding member 73 covers at least a part of the second soft part 715. The first shielding member 72 is separated from the first soft part 714 by a fixed distance. The second shielding member 73 is separated from the second soft part 715 by a fixed distance. Therefore, during the bending of the foldable display device, the first shielding member 72 and the second shielding member 73 can drive the elastic shielding member 71 to be pulled up or compressed.

Moreover, as shown in FIG. 4, when the bending mechanism 20 is in the first folded state, the shielding mechanism 70 is located on a side of the housing 10 away from the flexible display panel 30, and the first soft part 714 and the second soft part 715 both are in a stretched state. As shown in FIG. 5, when the bending mechanism 20 is in the second folded state, the elastic shielding member 71 is located between the first housing 11 and the second housing 12, and the first soft part 714 and the second soft part 715 both are in a compressed state.

It can be understood that in this embodiment, when the foldable display device is bent from the unfolded state to the first folded state or the second folded state, a distance between the shielding mechanism 70 and the flexible display panel 30 is always kept constant. The first shielding member 72 is fixedly connected to the first housing 11, which restricts the first shielding member 72 from moving synchronously with the first housing 11. The second shielding member 73 is fixedly connected to the second housing 12, which restricts the second shielding member 73 from moving synchronously with the second housing 12. This avoids an increase in a distance between the shielding mechanism 70 and the housing 10 during the bending of the foldable display device. Furthermore, the second hard part 712 is fixedly connected to the side of the first support plate 221 away from the bending portion 21, which restricts the second hard part 712 from moving synchronously with the first support plate 221. The third hard part 713 is fixedly connected to the side of the second support plate 231 away from the bending portion 21, which restricts the third hard part 713 from moving synchronously with the second support plate 231. This avoids an increase in a distance between the elastic shielding member 71 and the housing 10 during the bending of the foldable display device. Therefore, during the bending of the foldable display device, the shielding mechanism 70 always supports and shields the flexible display panel 30.

Furthermore, in this embodiment, the foldable display device may further comprise a touch pen 80. The touch pen 80 can be used to click and touch the flexible display panel 30. The second housing 12 is provided with a pen slot 121. When the touch pen 80 is not in use, the touch pen 80 may be accommodated in the pen slot 121. When the touch pen 80 needs to be used, the touch pen 80 may be taken out of the pen slot 121.

In the above, the present disclosure provides a foldable display device. The foldable display device comprises a housing, a bending mechanism disposed in the housing, a flexible display panel disposed in the housing and on a side of the bending mechanism, and a front frame structure covering at least a part of a side surface of the flexible display panel. The housing comprises a first housing and a second housing. The bending mechanism comprises a bending portion, a first support portion, and a second support portion. The first support portion comprises a first support plate and a first movement mechanism. The first support plate is rotatably connected to the side of the bending portion. An end of the first movement mechanism is slidably connected to the first support plate, and another end of the first movement mechanism is fixedly connected to the first housing, thereby driving the first housing away from or close to the bending portion. The second support portion comprises a second support plate and a second movement mechanism. The second support plate is rotatably connected to the opposite side of the bending portion. An end of the second movement mechanism is slidably connected to the second support plate, and another end of the second movement mechanism is fixedly connected to the second housing, thereby driving the second housing away from or close to the bending portion. The front frame structure comprises a first front frame portion connected to the first housing, a second front frame portion connected to the first support portion, a third front frame portion connected to the second support portion, and a fourth front frame portion connected to the second housing. When the folding display device is folded at any angle, sides of the flexible display panel and a gap between the housing and the bending mechanism are encapsulated, thereby preventing the flexible display panel from being exposed and damaged.

It should be understood that those skilled in the art may make equivalent replacements or changes based on the technical solutions and inventive concepts of the present application, and all such changes or replacements shall fall within the scope of the claims of the present application.

What is claimed is:

1. A foldable display device, comprising:
   a housing comprising a first housing and a second housing;
   a bending mechanism disposed in the housing, connected to the first housing and the second housing, and comprising:
      a bending portion;
      a first support portion disposed on a side of the bending portion and corresponding to the first housing, wherein a side of the first support portion is rotatably connected to the side of the bending portion, and an opposite side of the first support portion is slidably connected to the first housing; and
      a second support portion disposed on an opposite side of the bending portion and corresponding to the second housing, wherein a side of the second support portion is rotatably connected to the opposite side of the bending portion, and an opposite side of the second support portion is slidably connected to the second housing;

a flexible display panel disposed in the housing and on sides of the first housing, the second housing, and the bending mechanism; and a front frame structure disposed on a side of the flexible display panel away from the housing, covering at least a part of a side surface of the flexible display panel, and comprising a first front frame portion connected to the first housing, a second front frame portion connected to the first support portion, a third front frame portion connected to the second support portion, and a fourth front frame portion connected to the second housing.

2. The foldable display device according to claim 1, wherein when the flexible display panel is in a first folded state, the first housing and the second housing are both located away from the bending portion;

when the flexible display panel is in a second folded state, the first housing and the second housing are both located close to the bending portion; and a radius of curvature of the flexible display panel in the first folded state is less than a radius of curvature of the flexible display panel in the second folded state.

3. The foldable display device according to claim 2, wherein the first support portion comprises a first support plate and a first movement mechanism, the first support plate is rotatably connected to the side of the bending portion, an end of the first movement mechanism is slidably connected to the first support plate, and another end of the first movement mechanism is fixedly connected to the first housing; and the second support portion comprises a second support plate and a second movement mechanism, the second support plate is rotatably connected to the opposite side of the bending portion, an end of the second movement mechanism is slidably connected to the second support plate, and another end of the second movement mechanism is fixedly connected to the second housing.

4. The foldable display device according to claim 3, wherein the first movement mechanism comprises a first transmission mechanism and a first sliding plate, the first transmission mechanism is rotatably connected to the bending portion along a first axis and slidably connected to the first sliding plate, and the first sliding plate is fixedly connected to the first housing; and the second movement mechanism comprises a second transmission mechanism and a second sliding plate, the second transmission mechanism is rotatably connected to the bending portion along a second axis and slidably connected to the second sliding plate, and the second sliding plate is fixedly connected to the second housing.

5. The foldable display device according to claim 1, wherein the first front frame portion is separated from the second front frame portion by a first predetermined distance, the third front frame portion is separated from the fourth front frame portion by a second predetermined distance, the second front frame portion is separated from the first support portion by a fixed distance, and the third front frame portion is separated from the second support portion by a fixed distance.

6. The foldable display device according to claim 5, wherein the second front frame portion comprises a first package body and a first extension portion disposed on the first package body, the first package body covers one part of the side surface of the flexible display panel, and the second front frame portion is connected to the first support plate through the first extension portion; and the third front frame portion comprises a second package body and a second extension portion disposed on the second package body, the second package body covers another part of the side surface of the flexible display panel, and the third front frame portion is connected to the second support plate through the second extension portion.

7. The foldable display device according to claim 6, wherein the first package body comprises a first front end and a first side end, the first front end is disposed corresponding to a light-emitting surface of the flexible display panel, and the first side end is disposed corresponding to the side surface of the flexible display panel and comprises the first extension portion; and the second package body comprises a second front end and a second side end, the second front end is disposed corresponding to the light-emitting surface of the flexible display panel, and the second side end is disposed corresponding to the side surface of the flexible display panel and comprises the second extension portion.

8. The foldable display device according to claim 7, wherein the first front frame portion is provided with a first buckle on its side close to the first housing, the first housing is provided with a first slot corresponding to the first buckle, and the first buckle is fixedly connected to the first slot;

the fourth front frame portion is provided with a second buckle on its side close to the second housing, the second housing is provided with a second slot corresponding to the second buckle, and the second buckle is fixedly connected to the second slot.

9. The foldable display device according to claim 8, wherein when the bending mechanism is in a first folded state, a distance between the first front frame portion and the second front frame portion is greater than the first predetermined distance, and a distance between the third front frame portion and the fourth front frame portion is greater than the second predetermined distance; and when the bending mechanism is in a second folded state, a distance between the first front frame portion and the second front frame portion is less than the first predetermined distance, and a distance between the third front frame portion and the fourth front frame portion is less than the second predetermined distance.

10. The foldable display device according to claim 5, further comprising:

a soft strip disposed on a side of the light-emitting surface of the flexible display panel and disposed between the front frame structure and the flexible display panel, wherein opposite ends of the soft strip are respectively connected to the first front frame portion and the fourth front frame portion, when the bending mechanism is in a first folded state, the soft strip is located between the first housing and the second housing and is in a compressed state, and when the bending mechanism is in a second folded state, the soft strip is located on the side of the flexible display panel away from the housing and is in a stretched state.

11. The foldable display device according to claim 10, wherein the first front frame portion is provided with a first hook, a first end of the soft strip is provided with a first opening corresponding to the first hook, the fourth front frame portion is provided with a second hook, and a second end of the soft strip is provided with a second opening corresponding to the second hook.

12. The foldable display device according to claim 10, wherein
the second front frame portion is provided with a first sliding rail on its side close to the soft strip, the flexible strip is at least partially disposed in the first sliding rail, and the soft strip is slidably connected with the second front frame portion; and
the third front frame portion is provided with a second sliding rail on its side close to the soft strip, the soft strip is at least partially disposed in the second sliding rail, and the soft strip is slidably connected with the third front frame portion.

13. The foldable display device according to claim 10, further comprising:
a dust plug disposed on the side surface of the flexible display panel, disposed corresponding to the bending portion, and comprising a third sliding rail, wherein the soft strip is at least partially disposed in the third sliding rail and is slidably connected with the dust plug.

14. The foldable display device according to claim 13, wherein the dust plug comprises a body part and a hook part, the body part is disposed corresponding to the side surface of the flexible display panel, the hook part is disposed on a side of the soft strip away from the flexible display panel, and the third sliding rail is provided at a junction of the body part and the hook part.

15. The foldable display device according to claim 14, further comprising:
a rear cover disposed corresponding to the bending portion, connected to the bending portion, and located on a side of the bending mechanism away from the flexible display panel, wherein the body part of the dust plug is connected with the rear cover.

16. The foldable display device according to claim 1, further comprising:
a shielding mechanism disposed on a side of the bending mechanism away from the flexible display panel and covering the flexible display panel, wherein two opposite side parts and a middle part of the shielding mechanism are made of a hard material, and the other parts of the shielding mechanism are made of an elastic soft material.

17. The foldable display device according to claim 16, wherein the shielding mechanism comprises:
an elastic shielding member comprising a first hard part located at its middle part, and a second hard part and a third hard part located at its opposite sides, wherein the first hard part is fixedly connected to the bending portion, the second hard part is fixedly connected to the first support portion, and the third hard part is fixedly connected to the second support portion;
a first shielding member disposed on a side of the elastic shielding member and fixedly connected to the first housing; and
a second shielding member disposed on an opposite side of the elastic shielding member and fixedly connected to the second housing.

18. The foldable display device according to claim 17, wherein the shielding mechanism further comprises:
a first soft part disposed between the first hard part and the second hard part, wherein the first shielding member covers at least a part of the first soft part, and the first shielding member is separated from the first soft part by a third predetermined distance; and
a second soft part disposed between the first hard part and the third hard part, wherein the second shielding member covers at least a part of the second soft part, and the second shielding member is separated from the second soft part by a fourth predetermined distance.

19. The foldable display device according to claim 18, wherein when the foldable display device is in a first folded state or a second folded state, the shielding mechanism slides relative to the first shielding member and the second shielding member.

20. The foldable display device according to claim 19, wherein
when the bending mechanism is in the first folded state, the shielding mechanism is located on a side of the housing away from the flexible display panel, and the first soft part and the second soft part both are in a stretched state; and
when the bending mechanism is in the second folded state, the elastic shielding member is located between the first housing and the second housing, and the first soft part and the second soft part both are in a compressed state.

* * * * *